(12) United States Patent
Mohseni et al.

(10) Patent No.: US 10,713,584 B2
(45) Date of Patent: Jul. 14, 2020

(54) CONSTRUCTING AND PROGRAMMING QUANTUM HARDWARE FOR ROBUST QUANTUM ANNEALING PROCESSES

(71) Applicant: Google LLC, Mountain View, CA (US)

(72) Inventors: Masoud Mohseni, Redondo Beach, CA (US); Hartmut Neven, Malibu, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/453,477

(22) Filed: Jun. 26, 2019

(65) Prior Publication Data

US 2019/0318259 A1  Oct. 17, 2019

Related U.S. Application Data

(62) Division of application No. 15/109,614, filed as application No. PCT/US2014/072959 on Dec. 31, 2014, now Pat. No. 10,346,760.

(60) Provisional application No. 61/985,348, filed on Apr. 28, 2014, provisional application No. 61/924,207, filed on Jan. 6, 2014.

(51) Int. Cl.
*G06N 10/00* (2019.01)
*G06N 20/00* (2019.01)
*G06F 15/82* (2006.01)
*H01L 39/02* (2006.01)
*H01L 39/22* (2006.01)
*G06F 17/11* (2006.01)
*G06N 7/00* (2006.01)

(52) U.S. Cl.
CPC ............ *G06N 10/00* (2019.01); *G06F 15/82* (2013.01); *G06F 17/11* (2013.01); *G06N 7/005* (2013.01); *G06N 20/00* (2019.01); *H01L 39/025* (2013.01); *H01L 39/223* (2013.01); *H01L 39/228* (2013.01)

(58) Field of Classification Search
CPC ........ G06N 10/00; G06N 20/00; G06N 7/005; H01L 39/228; H01L 39/223; H01L 39/025; G06F 15/82; G06F 17/11
See application file for complete search history.

(56) References Cited

U.S. PATENT DOCUMENTS

| 6,979,836 | B2 | 12/2005 | Zagoskin | |
|---|---|---|---|---|
| 7,307,275 | B2 * | 12/2007 | Lidar | B82Y 10/00 257/31 |
| 7,788,192 | B2 | 8/2010 | Amin | |

(Continued)

FOREIGN PATENT DOCUMENTS

| CN | 101548288 A | 9/2009 |
|---|---|---|
| CN | 102037475 A | 4/2011 |

(Continued)

OTHER PUBLICATIONS

Albash et al., "Quantum adiabatic Markovian master equations," New J Phys, 14, Dec. 11, 2012, 41 pages.

(Continued)

*Primary Examiner* — Khamdan N. Alrobaie
(74) *Attorney, Agent, or Firm* — Fish & Richardson P.C.

(57) ABSTRACT

Among other things, an apparatus comprises quantum units; and couplers among the quantum units. Each coupler is configured to couple a pair of quantum units according to a quantum Hamiltonian characterization of the quantum by the coupler.

6 Claims, 6 Drawing Sheets

(56) References Cited

U.S. PATENT DOCUMENTS

Figure 1:
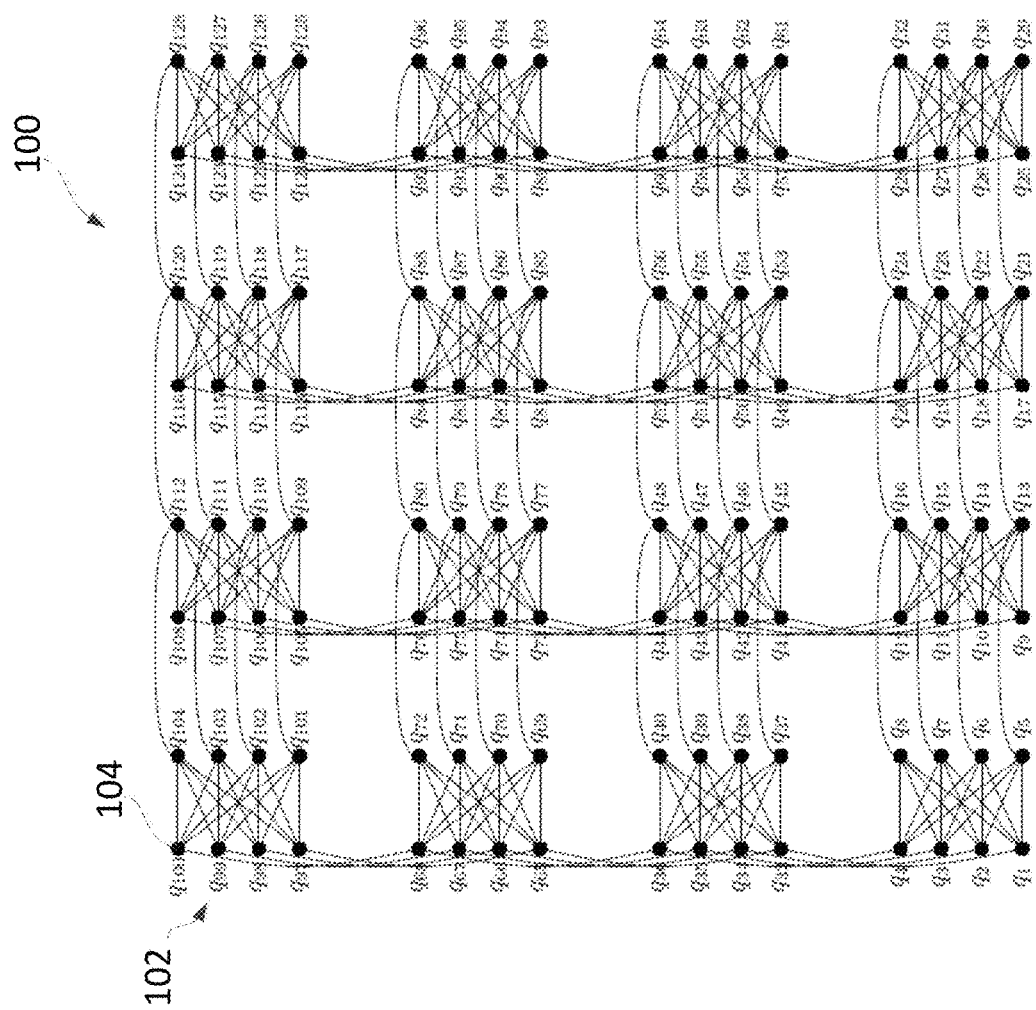

| | | | |
|---|---|---|---|
| 8,229,863 | B2 | 7/2012 | Armin et al. |
| 9,934,468 | B2* | 4/2018 | Mohseni ............... G06N 20/00 |
| 10,510,015 | B2* | 12/2019 | Mohseni ............... G06N 20/00 |
| 2004/0000666 | A1 | 1/2004 | Lidar et al. |
| 2005/0101489 | A1 | 5/2005 | Blais et al. |
| 2005/0224784 | A1 | 10/2005 | Amin |
| 2007/0180586 | A1 | 8/2007 | Amin |
| 2008/0086438 | A1 | 4/2008 | Amin et al. |
| 2008/0162613 | A1 | 7/2008 | Amin et al. |
| 2009/0299947 | A1 | 12/2009 | Amin et al. |
| 2010/0258746 | A1 | 10/2010 | Na et al. |
| 2011/0060780 | A1 | 3/2011 | Berkley |
| 2011/0133770 | A1 | 6/2011 | Przybysz et al. |
| 2011/0231462 | A1 | 9/2011 | Macready et al. |
| 2012/0023053 | A1 | 1/2012 | Harris et al. |
| 2012/0254586 | A1 | 10/2012 | Amin et al. |
| 2015/0262073 | A1 | 9/2015 | Lanting |
| 2015/0310350 | A1* | 10/2015 | Niskanen ............... G06N 5/022 706/46 |
| 2016/0328659 | A1 | 11/2016 | Mohseni |
| 2016/0335560 | A1 | 11/2016 | Mohseni et al. |
| 2016/0343932 | A1 | 11/2016 | Mohseni |
| 2018/0197102 | A1 | 7/2018 | Mohseni et al. |

FOREIGN PATENT DOCUMENTS

| | | |
|---|---|---|
| JP | 2005-527902 | 9/2005 |
| JP | 2011-523757 | 8/2011 |
| JP | 2011-524043 | 8/2011 |
| WO | WO2003090162 | 10/2003 |
| WO | WO2009075861 | 6/2009 |
| WO | WO2009143166 | 11/2009 |
| WO | WO 2012/082938 | 6/2012 |

OTHER PUBLICATIONS

Brif et al. "Exploring adiabatic quantum trajectories via optimal control," arXiV preprint arXiV 1310.3443v1, Oct. 13, 2013, 19 pages.

CN Office Action in Chinese Appln. 201480074980.8, dated Mar. 23, 2018, 10 pages (with English translation).

Dash et al. "A note on QUBO instances defined on Chimera graphs," arXiv preprint arXiv 1306.1202, Jul. 1, 2013, 8 pages.

De Vega et al. "Effects of dissipation on an adiabatic quantum search algorithm," New Journal of Physics, Institute of Physics Publishing, Bristol, GB, vol. 12(12) Dec. 8, 2010, 19 pages.

EP Office Action in European Appln. 14876158.8-1211, dated Jun. 7, 2018, 7 pages.

Extended European Search Report issued in Application No. 14876158. 8, dated Jul. 14, 2017, 9 pages.

Extended European Search Report issued in European Application No. 14876050.7, dated Aug. 28, 2017, 10 pages.

International Preliminary Report on Patentability in International Application No. PCT/US2014/072959, dated Jul. 21, 2016, 7 pages.

International Preliminary Report on Patentability in International Application No. PCT/US2014/072962, dated Jul. 21, 2016, 7 pages.

International Search Report and Written Opinion in Application No. PCT/US2014/0072959, dated May 27, 2015, 16 pages.

International Search Report and Written Opinion in Application No. PCT/US2014/072962, dated Apr. 28, 2015, 10 pages.

Jp Office Action in Japanese Appln. 2016-562458, dated Nov. 26, 2018 (waiting on English translation), 9 pages.

Kallush and Kolosof, "Quantum governor: Automatic quantum control and reduction of the influence of noise without measuring," Physical Review A 73.3, Nov. 21, 2005, 12 pages.

Makhlin et al., "Josephson junction qubits with controlled couplings," Nature 398:307-307, Mar. 25, 1999, 5 pages.

Niskanen et al., "Quantum Coherent Tunable Coupling of Superconducting Qubits," Science 316:723-726, May 4, 2007, 5 pages.

Van der Ploeg et al., "Controllable Coupling of Superconducting Flux Qubits," Physical review letters 98.5, May 23, 2007, 4 pages.

CN Office Action in Chinese Application No. 201480074978, dated Jan. 19, 2020, 6 pages (with English translation).

AU Examination Report in Australian Application No. 2019201469, dated Jan. 29, 2020, 2 pages.

SG Office Action in Singapore Application No. 10201706473, dated Jun. 21, 2019, 6 pages.

* cited by examiner

CONSTRUCTING AND PROGRAMMING QUANTUM HARDWARE FOR ROBUST QUANTUM ANNEALING PROCESSES

CLAIM OF PRIORITY

This application is a divisional application of, and claims priority to, U.S. patent application Ser. No. 15/109,614, titled "CONSTRUCTING AND PROGRAMMING QUANTUM HARDWARE FOR ROBUST QUANTUM ANNEALING PROCESSES," filed on Jul. 1, 2016, which application is the International Application under 35 U.S.C. 371 of WIPO Application No. PCT/US2014/072959, filed on Dec. 31, 2014, which application claims priority under 35 USC § 119(e) to U.S. Patent Application Ser. No. 61/985,348, filed on Apr. 28, 2014, and U.S. Patent Application Ser. No. 61/924,207, filed on Jan. 6, 2014. The disclosure of each of the foregoing applications is incorporated herein by reference.

BACKGROUND

This specification relates to constructing and programming quantum hardware for quantum annealing processes that can perform reliable information processing at non-zero temperatures.

SUMMARY

Artificial intelligent tasks can be translated into machine learning optimization problems. To perform an artificial intelligence task, quantum hardware, e.g., a quantum processor, is constructed and programmed to encode the solution to a corresponding machine optimization problem into an energy spectrum of a many-body quantum Hamiltonian characterizing the quantum hardware. For example, the solution is encoded in the ground state of the Hamiltonian. The quantum hardware performs adiabatic quantum computation starting with a known ground state of a known initial Hamiltonian. Over time, as the known initial Hamiltonian evolves into the Hamiltonian for solving the problem, the known ground state evolves and remains at the instantaneous ground state of the evolving Hamiltonian. The energy spectrum or the ground state of the Hamiltonian for solving the problem is obtained at the end of the evolution without diagonalizing the Hamiltonian.

Sometimes the quantum adiabatic computation becomes non-adiabatic due to excitations caused, e.g., by thermal fluctuations. Instead of remaining at the instantaneous ground state, the evolving quantum state initially started at the ground state of the initial Hamiltonian can reach an excited state of the evolving Hamiltonian. The quantum hardware is constructed and programmed to suppress such excitations from an instantaneous ground state to a higher energy state during an early stage of the computation. In addition, the quantum hardware is also constructed and programmed to assist relaxation from higher energy states to lower energy states or the ground state during a later stage of the computation. The robustness of finding the ground state of the Hamiltonian for solving the problem is improved.

The details of one or more embodiments of the subject matter of this specification are set forth in the accompanying drawings and the description below. Other features, aspects, and advantages of the subject matter will be apparent from the description, the drawings, and the claims.

DESCRIPTION OF DRAWINGS

FIG. 1 is a schematic perspective view of a quantum annealing processor within a Chimera connectivity of interacting qubits.

FIG. 2 is a schematic diagram showing the structures and interactions of two qubits in a quantum processor, where the interactions include x-x and x-z interactions of a quantum governor.

FIG. 2A is a schematic diagram showing a Josephson box, including a Josephson junction and a capacitor.

FIG. 3 is a schematic diagram showing the effect of a quantum governor on transitions among instantaneous energy states during a quantum annealing process FIG. 4 is a schematic diagram showing the interplay of an initial Hamiltonian, a problem Hamiltonian, and a Hamiltonian of a quantum governor chosen for the problem Hamiltonian during a quantum annealing process.

FIG. 5 is a flow diagram of an example process for determining a quantum governor distribution.

FIG. 6 is a flow diagram of an example process for performing an artificial intelligence task.

DETAILED DESCRIPTION

Overview

Solutions to hard combinatorial problems, e.g., NP-hard problems and machine learning problems, can be encoded in the ground state of a many-body quantum Hamiltonian system, which is also called a quantum annealer ("QA"). A quantum annealing process at zero temperature limit is known as adiabatic quantum computation, in which the QA is initialized to a ground state of an initial Hamiltonian $H_i$ that is a known and easy to prepare. Over time, the QA is adiabatically guided within the Hilbert space to a problem Hamiltonian $H_p$ that encodes the problem. In theory, during the adiabatic quantum computation, the QA can remain in the instantaneous ground state of a Hamiltonian $H_{total}$ evolving from $H_i$ to $H_p$, where $H_{total}$ can be expressed as:

$$H_{total}=(1-s)H_i+sH_p,$$

where s is a time dependent control parameter:

$$s=t/t_T,$$

and $t_T$ is the total time of the adiabatic quantum computation. The QA will reach the ground state of the problem Hamiltonian $H_p$ with certainty, if the evolution of system is sufficiently slow with respect to the intrinsic energy scale of the system.

In reality, the quantum computation may not be completely adiabatic and the QA may reach an excited state of $H_{total}$ during the computation, which can lead to inaccurate result at the end of the quantum computation. For example, in many hard combinatorial optimization problems, e.g., in decision problems, when the problem Hamiltonian demonstrates a phase transition in its computational complexity, the size of a gap between an excited state and the ground state of $H_{total}$ can be small, e.g., exponentially small, with respect to the intrinsic energy scale of the system. In such situations, the QA may undergo a quantum phase transition and can reach a large number, e.g., an exponentially large number, of excited states. In addition, the QA may also deviate from the ground state of $H_{total}$ due to other factors such as quantum fluctuations induced by environmental interactions with the system and system imperfection errors, including control errors and fabrication imperfections. In this specification, the process of driving the QA from the ground state of $H_i$ to the ground state of $H_p$ is called a quantum annealing schedule or a quantum annealing process.

Quantum hardware, such as quantum processors, of this specification includes a quantum chip that defines a quantum governor ("QG") in addition to $H_i$ and $H_p$, such that the evolving Hamiltonian $H_{total}$ becomes $H_{tot}$:

$$H_{tot}=I(t)H_i+G(t)H_G+P(t)H_p+H_{AG-B},$$

where I(t) and P(t) represent the time-dependency of the initial and problem Hamiltonians, $H_i$ and $H_p$, respectively; G(t) represents the time-dependency of the QG Hamiltonian, $H_G$; and $H_{AG-B}$ is the interaction of the combined QA-QG system with its surrounding environment, commonly referred to as a bath. In a simplified example, I(t) equals (1–s), P(t) equals s, G(t) equals s(1–s), and $H_{AG-B}$ is assumed to be non-zero but constant during the quantum annealing process. The strength of $H_{AG-B}$ is related to spectral density of bath modes that can often be characterized off-line by a combination of experimental and theoretical quantum estimation/tomography techniques.

Generally, the QG can be considered as a class of non-information-bearing degrees of freedom that can be engineered to steer the dissipative dynamics of an information-bearing degree of freedom. In the example of $H_{total}$, the information-bearing degree of freedom is the QA. The quantum hardware is constructed and programmed to allow the QG to navigate the quantum evolution of a disordered quantum annealing hardware at finite temperature in a robust manner and improve the adiabatic quantum computation process. For example, the QG can facilitate driving the QA towards a quantum phase transition, while decoupling the QA from excited states of $H_{total}$ by making the excited states effectively inaccessible by the QA. After the quantum phase transition, the QA enters another phase in which the QA is likely to be frozen in excited states due to quantum localization or Anderson localization. The QG can adjust the energy level of the QA to be in tune with vibrational energies of the environment to facilitate the QA to relax into a lower energy state or the ground state. Such an adjustment can increase the ground state fidelity, i.e., the fidelity of the QA being in the ground state at the end of the computation, and allow the QA to avoid a pre-mature freeze in suboptimal solutions due to quantum localization.

Generally, the QA experiences four phases in a quantum annealing process of the specification, including initialization, excitation, relaxation, and freezing, which are explained in more detailed below. The QG can assist the QA in the first two phases by creating a mismatch between average phonon energy of the bath and an average energy level spacing of the QA to suppress unwanted excitations. In the third and fourth stages, the QG can enhance thermal fluctuations by creating an overlap between the spectral densities of the QA and the bath. The enhanced thermal fluctuations can allow the QA to have high relaxation rates from higher energy states to lower energy states or the ground state of the problem Hamiltonian $H_p$. In particular, the QG can allow the QA to defreeze from non-ground states caused by quantum localization.

The QG can be used to achieve universal adiabatic quantum computing when quantum interactions are limited due to either natural or engineered constraints of the quantum hardware. For example, a quantum chip can have engineering constraints such that the Hamiltonian representing the interactions of qubits on the quantum chip is a k-local stochastic Hamiltonian. The quantum hardware can be constructed and programmed to manipulate the structural and dynamical effects of environmental interactions and disorders, even without any control over the degrees of freedom of the environment.

Generally, the QG is problem-dependent. The quantum hardware of the specification can be programmed to provide different QGs for different classes of problem Hamiltonians. In some implementations, a QG can be determined for a given $H_p$ using a quantum control strategy developed based on mean-field and microscopic approaches. In addition or alternatively, the quantum control strategy can also implement random matrix theory and machine learning techniques in determining the QG. The combined QA and QG can be tuned and trained to generate desired statistical distributions of energy spectra for $H_p$, such as Poisson, Levy, or Boltzmann distributions.

Example Quantum Hardware

As shown in FIG. 1, in a quantum processor, a programmable quantum chip 100 includes 4 by 4 unit cells 102 of eight qubits 104, connected by programmable inductive couplers as shown by lines connecting different qubits. Each line may represent one or multiple couplers between a pair of qubits. The chip 100 can also include a larger number of unit cells 102, e.g., 8 by 8 or more.

Figure 2:
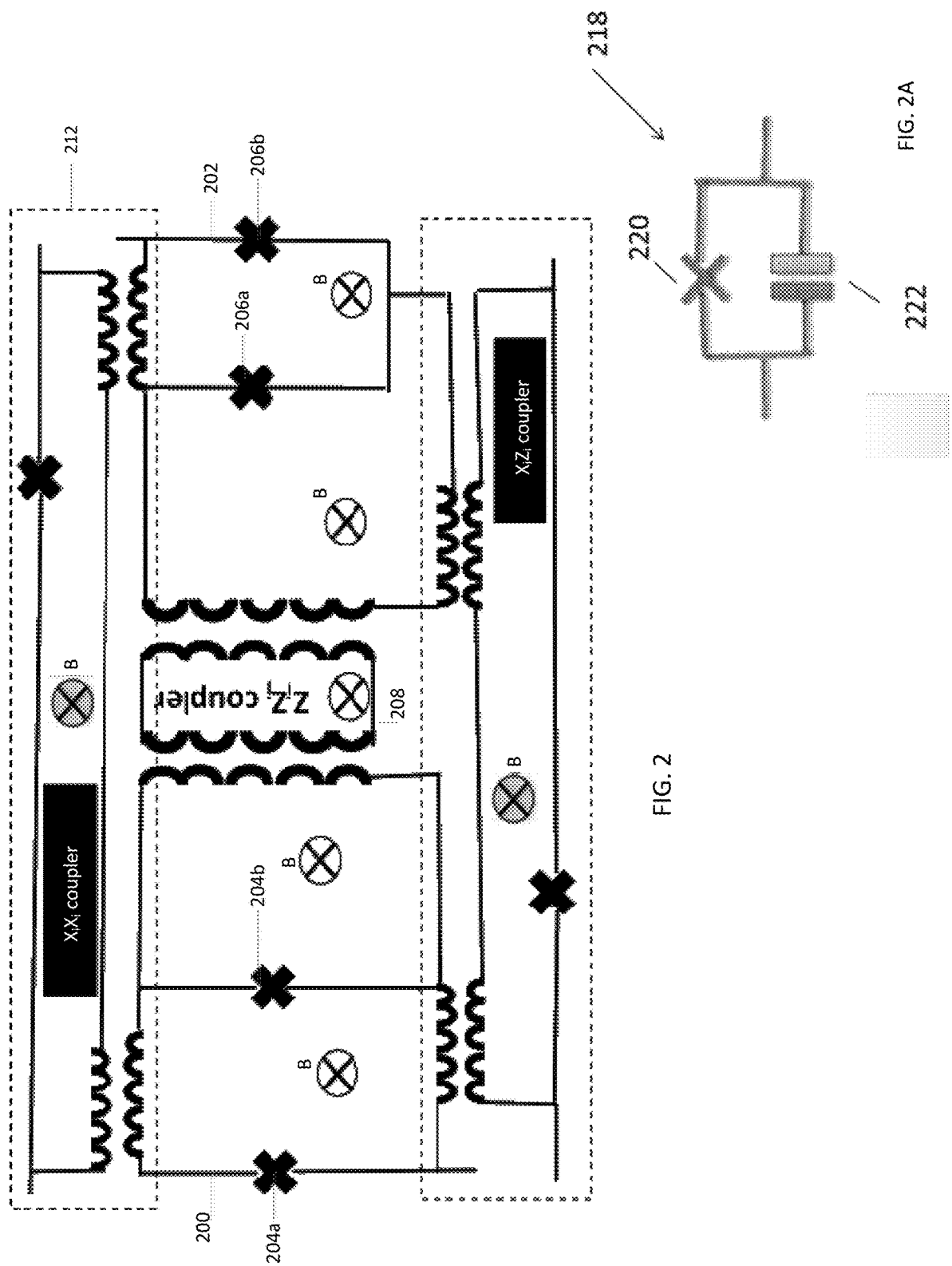

FIG. 2 shows an example pair of coupled qubits 200, 202 in the same unit cell of a chip, such as any pair of qubits in the unit cell 102 of the quantum chip 100. In this example, each qubit is a superconducting qubit and includes two parallelly connected Josephson boxes 204a, 204b or 206a, 206b. Each Josephson box can include a Josephson junction and a capacitance connected in parallel. An example is shown in FIG. 2A, in which a Josephson box 218 includes a Josephson junction 220 parallelly connected to a capacitance 222. The qubits 200, 202 are subject to an external magnetic field B applied along a z direction perpendicular to the surface of the paper on which the figure is shown; the B field is labeled by the symbol ⊗. Three sets of inductive couplers 208, 210, 212 are placed between the qubits 200, 202 such that the qubits are coupled via the z-z, x-z, and x-x spin interactions, where the z-z interactions represent the typical spin interactions of a QA, and the x-z, x-x interactions are auxiliary interactions representing the controllable degrees of freedom of a QG. Here x, y, and z are spin directions in Hilbert space, in which each direction is orthogonal to the other two directions.

Compared to one conventional quantum chip known in the art, the qubits that are coupled along the z-z spin directions in the chip 100 of FIG. 1 are additionally coupled along the x-z spin directions and the x-x spin directions through the coupler sets 210, 212. The Hamiltonian of the conventional quantum chip can be written as:

$$H_{SG} = I(t)\sum_i^N \sigma_i^z + P(t)\left(-\sum_i^N h_i\sigma_i^z + \sum_i^N J_{ij}\sigma_i^z\sigma_j^z\right)$$

where $\sigma_i^x$ and $\sigma_i^z$ quantum operators that have binary values and each represents the spin of the $i^{th}$ qubit along the x direction or the z direction, respectively. $h_i$ and $J_{ij}$ are parameters that can be programmed for different problems to be solved by adjusting the inductive coupler set 208. $h_i$ and $J_{ij}$ have real values. The sparsity of the parameter $J_{ij}$ is constrained by the hardware connectivity, i.e., the connectivity of the qubits shown in FIG. 1. For unconnected qubits, the corresponding $J_{ij}$ is 0. Again, I(t) and P(t) represent the time-dependency of initial and problem Hamiltonians, respectively. In a simplified example, I(t) equals (1−s), and P(t) equals s, where s equals $t/t_T$.

The additional coupler sets 210, 212 introduce additional quantum control mechanisms to the chip 100.

In general the control mechanisms of a QG acts within the same Hilbert space of the QA and include:

(i) Site dependent magnetic field on any spin, or quantum disorders, such as $\sigma_i^y$, which is also binary and represents the spin of the $i^{th}$ qubit along the y direction;

(ii) Two-body quantum exchange interaction terms, e.g., $\sigma_i^x \sigma_j^z$, that represents coupling of the $i^{th}$ and $j^{th}$ qubits along the x-z directions;

(iii) A global time-varying control knob G(t), which can be s(1−s), where $s=t/t_T$; and (iv) A set of macroscopic, programmable control parameters of the environment, such as the temperature T.

Accordingly, the Hamiltonian $H_{tot}$ for the combined QA-QG system in the chip 100 is:

$$H_{tot} = I(t)\sum_i^N \sigma_i^x + G(t)\left(\sum_{m\in\{x,y,z\}}\sum_i^N \varepsilon_{i,m}\sigma_i^m + \sum_{m,n\in\{x,y,z\}}\sum_{i<j}^N g_{ijmn}\sigma_i^m\sigma_j^n\right) + P(t)\left(-\sum_i^N h_i\sigma_i^z + \sum_i^N J_{ij}\sigma_i^z\sigma_j^z\right)$$

where $\varepsilon_{i,m}$ denotes the QG induced disorders, the tensor $g_{ijmn}$ defines the general two-body interaction parameters that specify the QG, and I(t), G(t), and P(t) are as described above. In this Hamiltonian, the initial Hamiltonian is:

$$H_i = \sum_i^N \sigma_i^x,$$

the problem Hamiltonian $H_p$ is:

$$H_p = -\sum_i^N h_i\sigma_i^z + \sum_i^N J_{ij}\sigma_i^z\sigma_j^z,$$

and the QG Hamiltonian $H_{QG}$ is:

$$H_{QG} = \sum_{m\in\{x,y,z\}}\sum_i^N \varepsilon_{i,m}\sigma_i^m + \sum_{m,n\in\{x,y,z\}}\sum_{i<j}^N g_{ijmn}\sigma_i^m\sigma_j^n.$$

Again, the total Hamiltonian is:

$$H_{tot} = (1-t/t_T)H_i + t/t_T(1-t/t_T)H_{QG} + (t/t_T)H_p.$$

Programming the Quantum Hardware

For a given problem and its corresponding problem Hamiltonian $H_p$, a QG is determined to improve the ground state fidelity of the QA. The QG can be determined without needing to diagonalize $H_p$. Various QG realizations can be repeated to statistically improve knowledge about the computational outcomes.

In some implementations, a QG is determined such that before a system characterized by $H_{total}$ experiences a quantum phase transition, the QG Hamiltonian $H_{QG}$ acts to suppress excitations of the QA. In particular, the QG is out of resonance with the average phonon energy of the bath, which creates a mismatch between the average phonon energy and average energy level spacing of the combined QA and QG, or $H_{tot}$ to reduce unwanted excitations. After the system undergoes the quantum phase transition, the QG Hamiltonian $H_{QG}$ acts to enhance relaxation of the QA from any excited state to the ground state of $H_{tot}$. In particular, the average energy level spacing of $H_{tot}$ is in resonance with the average phonon energy. The QG enhances thermal fluctuations by creating an overlap between the spectral densities of the system and its bath. The thermal fluctuations can facilitate the QA to reach the ground state of $H_{tot}$ at a high relaxation rate and prevent the QA from being prematurely frozen at an excited state due to quantum localization.

Figure 3:
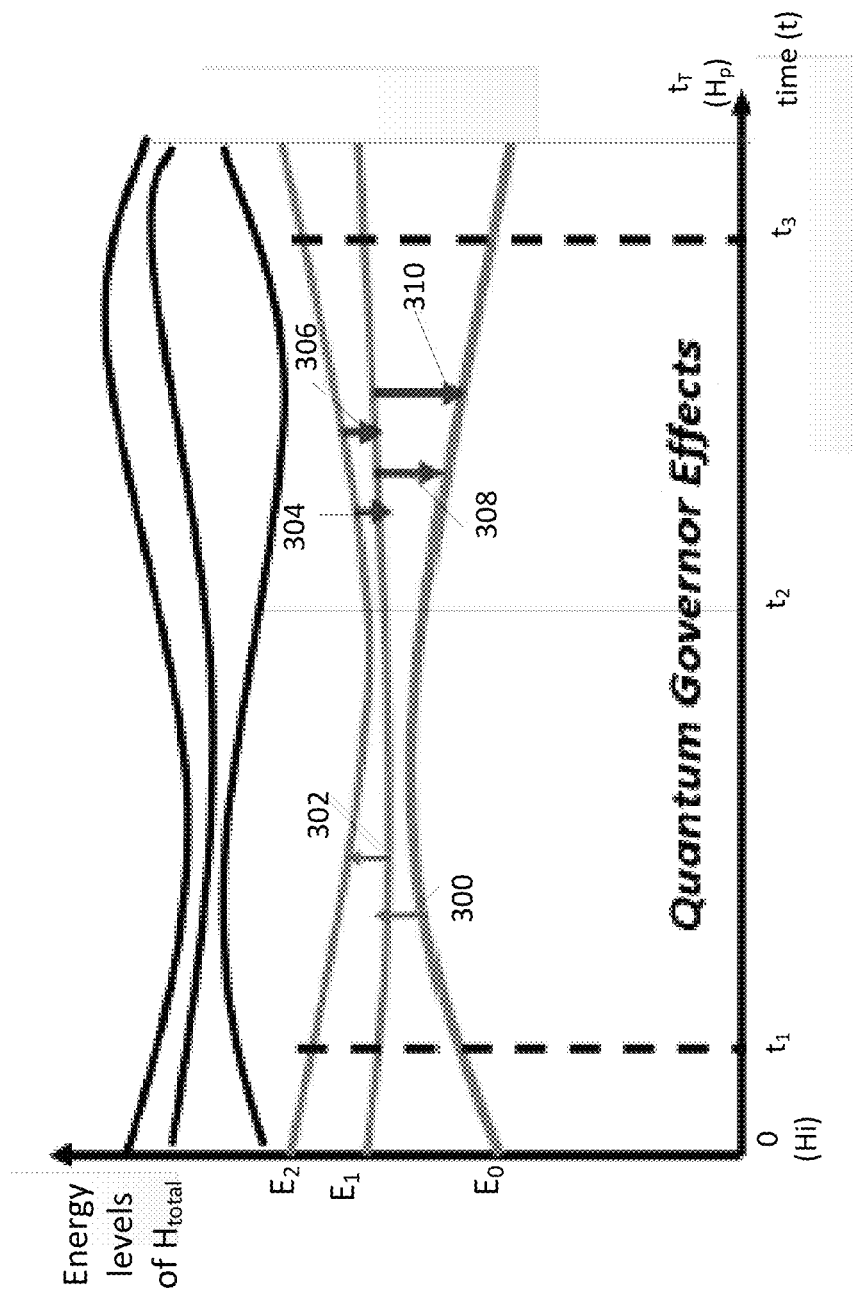

An example of desirable QG functions is shown in FIG. 3. The energy levels $E_0$, $E_1$, $E_2$, ... $E_i$ (not shown) of $H_{total}$ are plotted as a function of time t. At t=0, $H_{total}$ is $H_i$, and at $t=t_T$, $H_{total}$ is $H_p$. During a quantum annealing process from t=0 to $t=t_T$, the QA approximately experiences an initialization phase from t=0 to $t=t_1$, an excitation phase from $t=t_1$ to $t=t_2$, a relaxation phase from $t=t_2$ to $t=t_3$, and a freezing phase from $t=t_3$ to $t=t_T$. The time $t_2$ can correspond to a time at which a quantum phase transition occurs in a system characterized by $H_{total}$. During the excitation phase, the QG increases, as indicated by arrows 300, 302, the average energy spacing between adjacent energy levels $\Delta\varepsilon_i$, such as $\Delta\varepsilon_i = E_2 - E_1$ and $\Delta\varepsilon_0 = E_1 - E_0$, such that the increased energy spacing is much larger than the average phonon energy. During the relaxation phase, the QG adjusts the average energy spacing $\Delta\varepsilon_0$, $\Delta\varepsilon_1$, ... to be comparable to the average phone energy to facilitate relaxation of the QA from excited states to lower energy states or the ground state, as indicated by arrows 304, 306, 308, 310.

Figure 4:
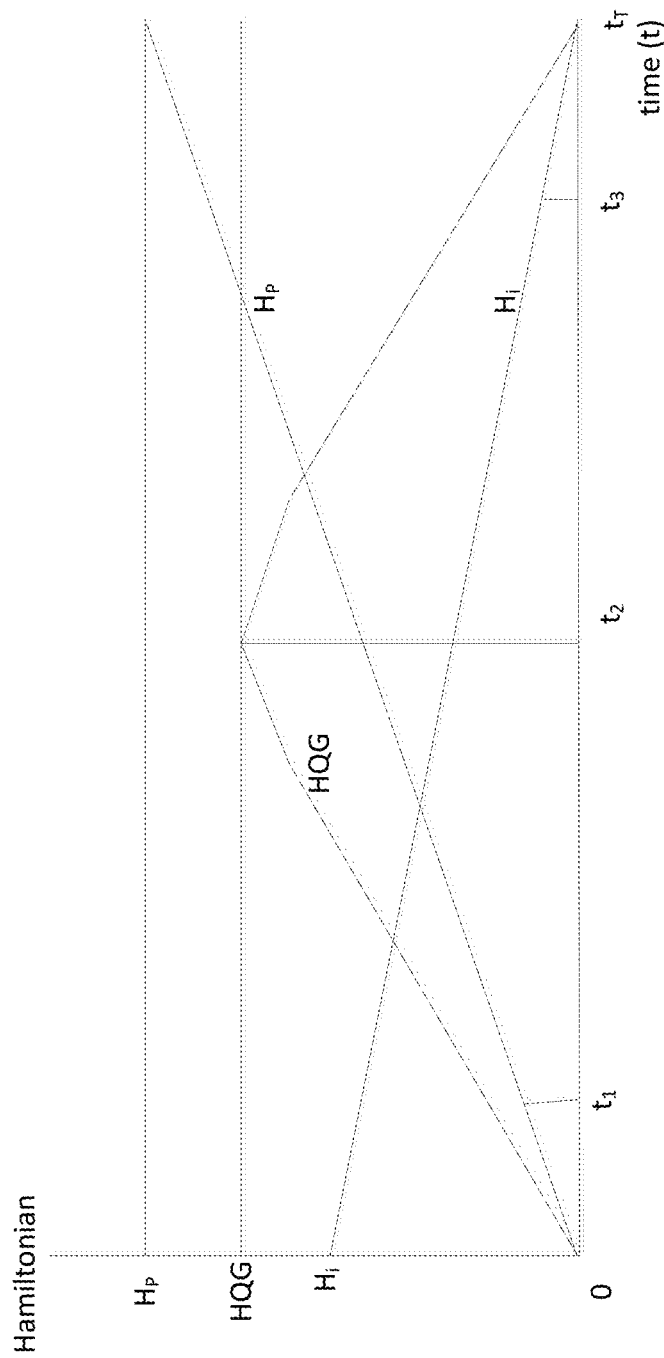

The interplay of the three Hamiltonians, $H_i$, $H_p$, and $H_{QG}$ over time in different phases of the quantum annealing process is schematically shown in FIG. 4. The control parameters I(t), P(t), and G(t) control the shapes of the curves for the corresponding Hamiltonians. In this example, I(t) and P(t) are linear and G(t) is parabolic.

In addition, the QG can be chosen to allow the QA of $H_{tot}$ to steadily evolve over the QA schedule and reach a final state that has a maximum overlap with the ground state of $H_p$. Ideally, the ground state fidelity of the QA at time $t_T$ is 1. However, unity fidelity is hard to achieve within a finite period of time. Other than at time 0 and at time $t_T$, the QA of $H_{tot}$ is in a mixed state of the combined $H_p$, $H_i$, and $H_{QG}$. The evolution of the QA can be expressed as:

$$|\varepsilon_0^i\rangle\langle\varepsilon_0^i| \to \rho_A(t) \to |\varepsilon_0^p\rangle\langle\varepsilon_0^p|$$

where $|\varepsilon_0^i\rangle$ is the state of the QA at time 0, $|\varepsilon_0^p\rangle$ is the state of the QA at time $t_T$, and $\rho_A(t)$ is the density function of the QA at other times. By assigning a probability, e.g., using a probability mass function, to each state $|\varepsilon_0^p\rangle$, the evolution of the QA can be further expressed as:

$$|\varepsilon_0^i\rangle\langle\varepsilon_0^i| \to \rho_A(t) \to \sum_k f^G(k)|\varepsilon_k^p\rangle\langle\varepsilon_k^p|$$

where $f^G(k)$ is the probability mass function, k=0, 1, ..., and corresponds to quantum state levels, and $\Sigma_k f^G(k)=1$. If the ground state fidelity is 1, then $f^G(0)=1$, and $f^G(k\neq 0)=0$. As described above, such a unity fidelity is hard to realize. Instead, a desirable QG can be selected to provide an exponential distribution function as:

$$f^G(k,\lambda_G) = \langle\varepsilon_k^p|\rho_A(t_T,\lambda_G)|\varepsilon_k^p\rangle$$

where $\lambda_G$ defines the distribution of a QG family suitable for use with $H_p$. The probability mass function can be any probability distribution function. Examples include Poisson distribution functions, Levy distribution functions, and Boltzmann distribution functions.

Figure 5:
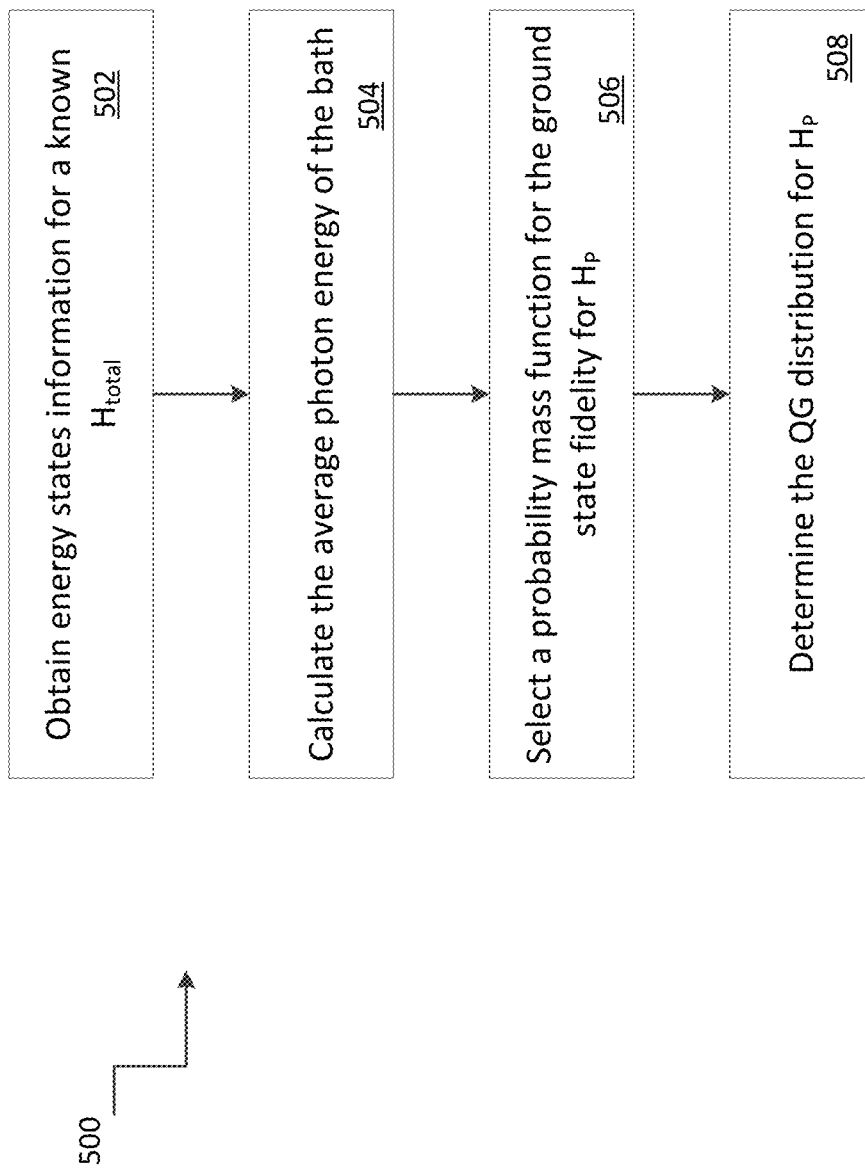

To determine a QG with desirable functions for a problem, including those functions described above with reference to FIGS. 3 and 4, one or more techniques can be used, including, for example, open quantum system models, random matrix theory, and machine learning. An example process 500 for determining a QG is shown in FIG. 5, which can be performed by a classical processor, such as a classical computer, or a quantum processor, or a combination of them.

In the process 500, information about energy states of a known $H_{total}$ is obtained (502). In some implementations, a QG is constructed using random matrix theory (RMT) and some predictions on general statistical properties of the combined QA-QG system can be made. In particular, using the random matrix theory, approximate distributions of the energy levels $E_i$ of the i energy states, where i is 0, 1, 2, ..., a spontaneous energy spectrum, the spacings $\Delta\varepsilon_i$ of the energy levels, and the average level spacing $\overline{\Delta\varepsilon}$ of the spacings can be obtained. In some implementations, the average energy level spacing $\overline{\Delta\varepsilon}$ is obtained using mean-field theories without explicitly diagonalizing $H_{total}$. In some examples, path-integral Monte-Carlo is used for evaluating an approximate ground state energy of $H_{total}$.

In some implementations, the average energy level spacing at time t is estimated as:

$$\overline{\Delta\varepsilon(t)} = \frac{2\sum_{i=0}^{N-1}|\varepsilon_i(t) - \varepsilon_j(t)|}{N(N-1)}$$

where $\varepsilon_i(t)$ is the energy of the $i^{th}$ instantaneous eigenstate energy of $H_{total}$, and N is the total number of eigenstates.

Also in the process 500, the average phonon energy of the bath in which the system characterized by $H_{total}$ is located is calculated (504). In approximation, the average phonon energy can be taken as kT, where k is the Boltzmann constant, and T is the temperature. The average phonon energy can also be calculated in a more precise manner. For example, an open quantum system model of dynamics, such as the Lindblad formalism, can be selected for the calculation. The selection can be based on calibration data of the quantum processor. Under the open quantum system model, the average phonon energy of a bath, in which a system represented by $H_{total}$ is located, at any given temperature T can be defined as:

$$\overline{\omega} = \frac{\sum_0^\infty \omega J(\omega)d\omega / (e^{\omega/kT} - 1)}{\sum_0^\infty J(\omega)d\omega / (e^{\omega/kT} - 1)},$$

where $J(\omega)$ can be the Omhic spectral density, i.e., $$J(\omega) = \lambda\omega e^{-\frac{\omega}{\gamma}},$$

the super-Omhic spectral density, i.e., $$J(\omega) = \lambda\omega^3 e^{-\frac{\omega}{\gamma}},$$

the Drude-Lorentz spectral density, i.e., $$J(\omega) = \frac{2\lambda\omega\gamma}{\omega^2 + \gamma^2},$$

or a flat spectral distribution, i.e., $J(\omega)=1$. In these equations, $\lambda$ is the reorganization energy and $\gamma$ is the bath frequency cut-off.

A probability mass function for the ground state fidelity of the QA is selected (506). In some implementations, the probability mass function is selected manually by a user. Based on the obtained information, the calculated average phonon energy, and the selected probability mass function, the process 500 then determines (508) a QG distribution for $H_p$. In some implementations, the determination process can be at least partially performed by a user. For example, the QG distribution can be represented by an exponential family, such as a Gaussian unitary ensemble, of random matrices selected using a random matrix theory model. The average energy level spacing $\overline{\Delta g}$ and the maximum and minimum energy eigenvalues of the QG or $H_{QG}$ are determined to allow the QG to function as desired. In particular, in the second phase of the QA schedule, e.g., during time $t_1$ to $t_2$ shown in FIG. 3, the average energy level spacing of the QG is chosen such that the chosen energy level spacing dominates the energy-level spacing of the problem Hamiltonian. The chosen energy level spacing is also much bigger than the average energy of the phonon bath, e.g., by a factor of 5-10, such that the average energy level spacing of the combined QA and QG $\overline{\Delta(g+\varepsilon)}$ becomes:

$$\overline{\Delta(g+\varepsilon)} \gg \overline{\omega}.$$

This choice increases the energy level spacing of $H_{total}$ such that the combined energy level spacing of $H_{tot}$ is much larger than the average phonon energy. Accordingly, possible excitations of the QA to a higher energy state by thermal fluctuation are suppressed. In addition, the QG is also selected such that in the third phase of the QA schedule, e.g., during time $t_2$ to $t_3$ shown in FIG. 3, the average energy level spacing of the QG leads to:

$$\overline{\Delta(g+\varepsilon)} \approx \overline{\omega}$$

This choice allows the energy level spacing of $H_{total}$ to be similar to the thermal fluctuation. The QA can relax to a lower energy state or the ground state at a high rate. The selected exponential family can be parameterized with respect to the controllable parameters, such as the coupling between qubits, of the quantum hardware.

Alternatively or in addition, a machine learning system can be used to tune the control parameters of the QG distribution selected based on the random matrix theory model. In some implementations, a deep neural network is used to represent the QG-QA system or the system characterized by $H_{tot}$, and stochastic gradient descent is used to train the QG distribution. As an example, the training is done by selecting a statistically meaningful number, e.g., 1000, of random matrices $\{\varepsilon_{im}; g_{ijmn}\}$ from a parameterized exponential family that can in average generate path-integral Monte-Carlo outputs, within the desired probability mass function for a given $H_{total}$ of interest. In some implementations, the training can start with an initial QG distribution selected based on the desired average combined energy level spacing $\overline{\Delta(g+\epsilon)}$ discussed above. The initial QG distribution can have predetermined probability distributions. The training can be supervised training.

Figure 6:
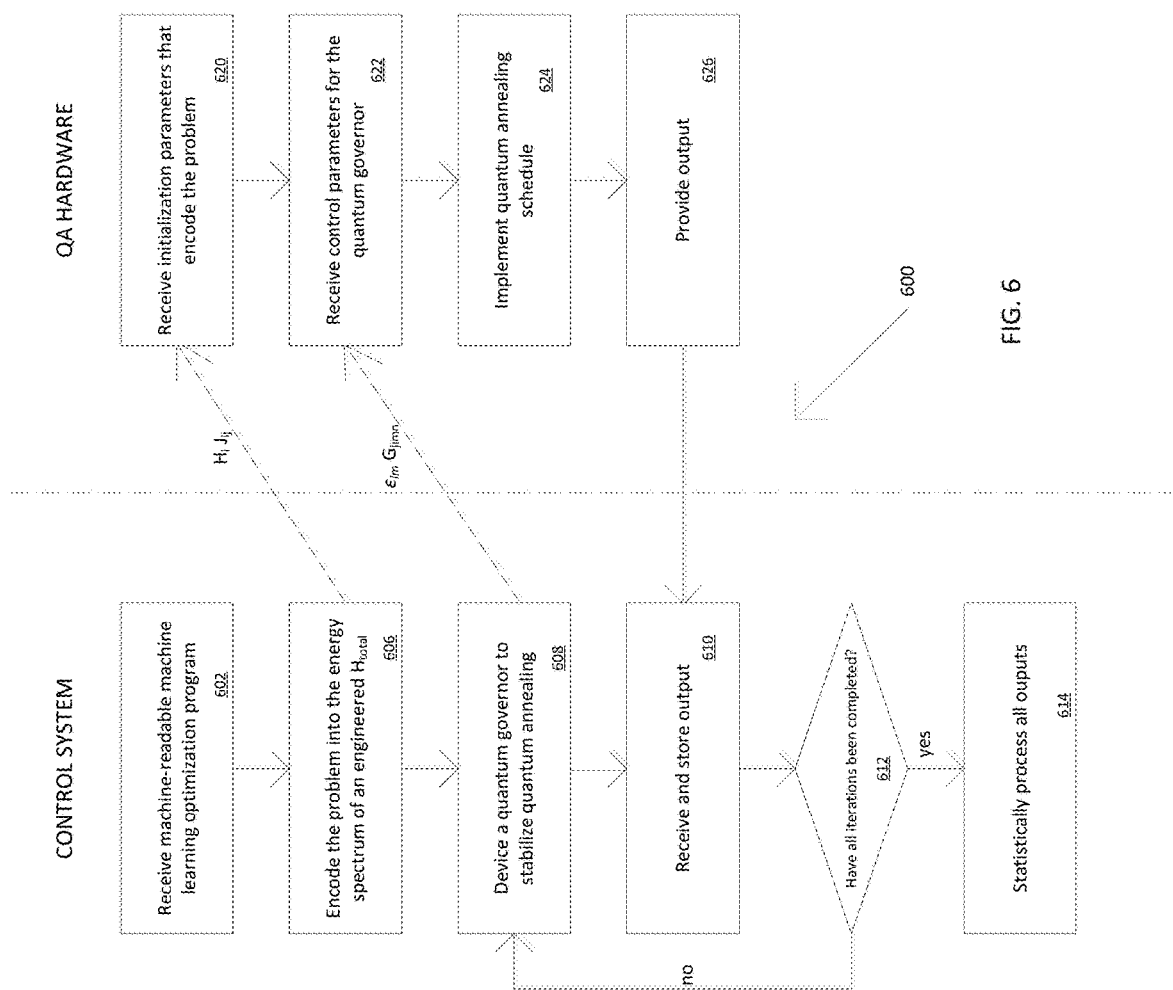

The implementation of the random matrix theory model can output a generative probability mass function. In supervised training, label can be generated by finding the coupling coefficients of the QG such that the probability mass function generated by the QA and the QG has maximum overlap, e.g., within a given measure or figure of merit such as $\chi^2$ divergence, with an ideal probability mass function that is known in advance for the training set. FIG. 6 shows an example process 600 in which a control system programs QA hardware, such as a quantum processor, for the QA hardware to perform an artificial intelligence task. The control system includes one or more classical, i.e., non-quantum, computers, and may also include a quantum computer. The task is translated into a machine learning optimization problem, which is represented in a machine-readable form.

The control system receives (602) the machine-readable machine learning optimization problem. The control system encodes (606) the optimization problem into the energy spectrum of an engineered $H_{total}$. The encoding is based on structure of the QA hardware, such as the couplings between qubits. An example of $H_{total}$ is the Ising Hamiltonian $H_{SG}$, and the encoding determines the values for the parameters $h_i$ and $J_{ij}$. The encoded information, such as $h_i$ and $J_{ij}$, is provided to the QA hardware, which receives (620) the information as initialization parameters for the hardware. To stabilize the QA during a quantum annealing process to be performed by the QA hardware, the control system further devises (608) a QG, e.g., by selecting one QG from a QG distribution determined using the process 500 of FIG. 5. The selection can be random (pseudo) selection. In some implementations, a user can select the QG from the QG distribution and input the selection to the control system. The devised QG is characterized by control parameters including $\epsilon_{im}$ and $g_{ijmn}$, which are sent to the QA hardware to program the QA hardware.

The QA hardware receives (620) the initialization parameters, such as $h_i$ and $J_{ij}$, and also receives (622) the control parameters for the QG, such as $h_i^G$, $J_{ij}^G$, $J_{ij}^{GA}$, and is programmed and initialized by the control system according to the received initialization parameters and QG parameters. The QA hardware implements (624) the quantum annealing schedule to obtain eigenstates of the combined QA-QG system characterized by $H_{tot}$. The solution to the machine learning optimization problem is encoded in these eigenstates. After a predetermined amount of time, the QA schedule ends and the QA hardware provides (626) an output represented by the eigenstates and their corresponding energy spectra. The output can be read by the control system or by another classical computer or quantum computer. The predetermined amount of time can be in the order of $1/(\overline{\Delta(g+\epsilon)})^2$. However, shorter or longer periods of time can be used. A shorter time period may provide better quantum speedup, and a longer time period may provide a higher ground state fidelity.

As described above, in the output provided by the QA hardware, the ground state fidelity of the QA is generally smaller than 1. When the fidelity is smaller than 1, the one-time output provided by the QA hardware may not accurately encode the solution to the problem. In some implementations, the QA hardware performs the QA schedule multiple times, using the same QG or different QGs provided by the control system that have different sets of control parameters, such as $\epsilon_{im}$ and $g_{ijmn}$, selected from the same QG distribution determined for the problem, to provide multiple outputs. The multiple outputs can be statistically analyzed and the problem or the artificial intelligence task can be resolved or performed based on the statistical results.

In particular, in the process 600, after the control system receives and stores (610) the output provided by the QA hardware, the control system determines (612) whether the QA hardware has completed the predetermined number of iterations of QA schedules. If not, then the control system returns to the step 608 by devising another QG, which can be the same as the previously used QG or a different QG selected from the previously determined QG distribution. The QA hardware receives (622) another set of control parameters for the QG and is re-programmed by the control system based on this set of control parameters and the previously determined initialization parameters that encode the problem. The QA schedule is implemented again (624) and another output is provided (626). If the QA hardware has completed the predetermined number of iterations of QA schedule, then the control system or another data processing system statistically processes (614) all outputs to provide solutions to the problem. Solutions to a problem can be provided with a predetermined degree of certainty that has a sharply peaked PDF about an actual solution to the problem. The PDF can be peaked based on the statistical analysis.

The predetermined number of iterations can be 100 iterations or more, or 1000 iterations or more. In some implementations, the number of iterations can be chosen in connection with the length of the QA schedule, so that the process 600 can be performed with high efficiency and provide solutions to the problems with high accuracy. For example, when the length of each QA schedule is relatively short, e.g., shorter than $1/(\overline{\Delta(g+\epsilon)})^2$, the predetermined number of iterations can be chosen to be relatively large, e.g., 1000 iterations or more. In other situations when the length of each QA schedule is relatively long, e.g., longer than $1/(\overline{\Delta(g+\epsilon)})^2$, the predetermined number of iterations can be chosen to be relatively small, e.g., less than 1000 iterations.

Embodiments of the digital, i.e., non-quantum, subject matter and the digital functional operations described in this specification can be implemented in digital electronic circuitry, in tangibly-embodied computer software or firmware, in computer hardware, including the structures disclosed in this specification and their structural equivalents, or in combinations of one or more of them. Embodiments of the digital subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to digital data processing hardware and encompasses all kinds of apparatus, devices, and machines for processing data, including by way of example a programmable digital processor, a digital computer, or multiple digital processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

The processes and logic flows described in this specification can be performed by one or more programmable digital computers, operating with one or more quantum processors, as appropriate, executing one or more computer programs to perform functions by operating on input data and generating output. The processes and logic flows can also be performed by, and apparatus can also be implemented as, special purpose logic circuitry, e.g., an FPGA or an ASIC, or by a combination of special purpose logic circuitry and one or more programmed computers. For a system of one or more digital computers to be "configured to" perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by digital data processing apparatus, cause the apparatus to perform the operations or actions.

Digital computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a digital computer will also include, or be operatively coupled to receive data from or transfer data to, or both, one or more mass storage devices for storing data, e.g., magnetic, magneto-optical disks, or optical disks. However, a computer need not have such devices.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

Control of the various systems described in this specification, or portions of them, can be implemented in a computer program product that includes instructions that are stored on one or more non-transitory machine-readable storage media, and that are executable on one or more digital processing devices. The systems described in this specification, or portions of them, can each be implemented as an apparatus, method, or electronic system that may include one or more digital processing devices and memory to store executable instructions to perform the operations described in this specification.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

The invention claimed is:

1. An apparatus comprising:
   quantum units; and
   couplers among the quantum units, each coupler being configured to couple a pair of quantum units,
   wherein the quantum units and the couplers are configured to be characterized by a quantum annealer and a quantum governor, and
   wherein the quantum units and the couplers are configured such that the quantum governor suppresses excitations of the quantum annealer from an instantaneous ground state to a higher energy state during a first period of time in a quantum annealing process, and facilitates relaxation of the quantum annealer from higher energy states to lower energy states or the ground state during a second period of time in the quantum annealing process.

2. The apparatus of claim 1, wherein the quantum annealer experiences four phases in the quantum annealing process, including initialization, excitation, relaxation, and freezing.

3. The apparatus of claim 2, wherein the first period of time comprises the initialization and excitation phases.

4. The apparatus of claim 3, wherein the second period of time comprises the relaxation and freezing phases.

5. The apparatus of claim 4, wherein in the first period of time, the quantum governor creates a mismatch between average phonon energy of a bath in which the quantum units and the couplers are located and an average energy level spacing of the quantum annealer to suppress unwanted excitations.

6. The apparatus of claim 4, wherein in the second period of time, the quantum governor enhances thermal fluctuations by creating an overlap between spectral densities of the quantum annealer and a bath in which the quantum units and the couplers are located.

* * * * *